United States Patent [19]

Ina et al.

[11] Patent Number: 4,952,060
[45] Date of Patent: Aug. 28, 1990

[54] ALIGNMENT METHOD AND A PROJECTION EXPOSURE APPARATUS USING THE SAME

[75] Inventors: Hideki Ina, Kawasaki; Fumio Sakai; Hitoshi Nakano, both of Yokohama, all of Japan

[73] Assignee: Canon Kabushiki Kaisha, Tokyo, Japan

[21] Appl. No.: 463,886

[22] Filed: Jan. 10, 1990

Related U.S. Application Data

[63] Continuation of Ser. No. 300,714, Jan. 24, 1989, abandoned, which is a continuation of Ser. No. 73,176, Jul. 14, 1987, abandoned.

[30] Foreign Application Priority Data

Jul. 17, 1986 [JP] Japan ............................ 61-166786

[51] Int. Cl.⁵ ............................................ G01B 27/53
[52] U.S. Cl. ..................................... 356/407; 356/400
[58] Field of Search ................. 356/400, 401; 250/557

[56] References Cited

U.S. PATENT DOCUMENTS

| | | | |
|---|---|---|---|
| 3,752,589 | 8/1973 | Kobayashi | 356/401 |
| 4,385,838 | 5/1983 | Nokazawa et al. | 356/401 |
| 4,573,791 | 3/1986 | Phillips | 356/401 |
| 4,629,313 | 12/1986 | Tanimoto | 356/401 |
| 4,699,515 | 10/1987 | Tamimoto et al. | 356/401 |

FOREIGN PATENT DOCUMENTS 55-4608  11/1980  Japan.

Primary Examiner—Richard A. Rosenberger
Attorney, Agent, or Firm—Fitzpatrick, Cella, Harper & Scinto

[57] ABSTRACT

A projection exposure apparatus is disclosed for exposing a semiconductor wafer to a pattern, formed on a reticle, by projection using a projection lens system. The apparatus includes an alignment optical system disposed at a side of the wafer remote from the projection lens system. The alignment optical system is used to detect an alignment mark provided on the wafer, from the back of the wafer. In accordance with the detection, the wafer is moved so that its alignment mark is brought into a predetermined positional relation with the alignment optical system, whereby the reticle and the wafer are relatively aligned. With this arrangement, the wafer alignment mark can be detected without being adversely affected by a resist layer applied to the wafer surface. Thus, the reticle and the wafer can be aligned very accurately.

20 Claims, 1 Drawing Sheet

ALIGNMENT METHOD AND A PROJECTION EXPOSURE APPARATUS USING THE SAME

This application is a continuation-in-part of application Ser. No. 300,714 filed Jan. 24, 1989, now abandoned, which in turn is a continuation of application Ser. No. 07/073,176, filed Jul. 14, 1987, now abandoned.

FIELD OF THE INVENTION AND RELATED ART

This invention relates generally to an alignment method for aligning an article. More particularly, the invention is concerned with an alignment method, usable in the manufacture of semiconductor devices such as integrated circuits, for aligning a reticle, having a pattern, with a wafer. In another aspect, the invention is concerned with a projection exposure apparatus using such an alignment method, for projecting and printing a pattern formed on a reticle upon a wafer having a resist surface layer.

Projection exposure apparatuses used in the manufacture of semiconductor devices, for projecting images of a pattern of a reticle upon different portions of the surface of a wafer in sequence by use of a projection lens system, include an alignment system wherein, for aligning the reticle and the wafer prior to the projection exposure, a light is projected from the projection lens system side upon an alignment mark formed on the wafer surface. Such alignment light is diffracted by edges of the wafer alignment mark and the diffracted light is detected by a photoelectric detector, whereby an alignment signal representing the position of the wafer is obtained.

For lithographic purposes, a wafer is usually coated with a photosensitive material, called "photoresist" or "resist", which is provided in the form of a surface transparent layer. Due to the nature of such a resist layer provided on the wafer surface or depending upon the conditions of such a resist coating, frequently there occurs interference between the light diffracted by the edges of the alignment mark (thus forming the alignment signal) and a portion of the alignment light as having been reflected by the surface of the resist layer and/or a portion of the alignment light as having been refracted by the resist material or multi-reflected within the resist layer. If such interference occurs, the alignment signal is adversely affected. Namely, it is possible that the existence of the resist surface layer on the wafer causes distortion of the alignment signal, deterioration of the signal- to-noise ratio, etc., and, in some cases, there is produced a false signal. As a result, it is not easy to assure high alignment accuracy.

For example, where a resist layer is formed on a wafer in accordance with a drop-and-spin method, usually the resist layer has surface unevenness which is generally oriented in radial directions of the wafer. If, in this case, the wafer alignment mark is provided by a surface protrusion, the resist coating in the neighborhood of the alignment mark is asymmetrical such as depicted in FIG. 2 of the attached drawings.

If such a wafer is used in a step-and-repeat type reduction projection exposure apparatus, called a "stepper", and the wafer is relatively aligned with a reticle each time one of different surface regions (shot areas) of the wafer is going to be exposed to the pattern of the reticle, by use of an alignment mark provided exclusively for each shot area, there occurs in the peripheral portion of the wafer surface such an alignment error that has a vector oriented in a radial direction with respect to the center of the wafer. This is illustrated schematically in FIG. 3. It is possible that such alignment error in a peripheral shot area on the wafer surface is greater than $3\sigma(=0.2$ micron). The most important factor of the occurrence of such alignment error is, as described with reference to FIG. 2, the asymmetrical application of the resist material 2 to the wafer 1 surface, on the opposite sides of the, wafer alignment mark WM, because such asymmetrical resist layer in the neighborhood of the wafer alignment mark affects asymmetrically the alignment signal which is obtained "through" the resist layer.

SUMMARY OF THE INVENTION

It is accordingly a primary object of the present invention to obviate the inconveniences described hereinbefore and thereby to provide an alignment method that assures high-accuracy pattern superimposition.

Briefly, in accordance with the present invention, to achieve this object, alignment marks of a wafer, which is a workpiece, are detected from the back side (usually the lower side) of the wafer. The alignment marks may be provided on the rear surface of the wafer or, alternatively, on the front surface of the wafer. According to one preferred form of the present invention, an alignment signal is obtained directly from an alignment mark formed on the rear surface of a wafer on which surface no resist material is applied. Thus, the alignment signal is obtainable not through the resist layer. In accordance with another preferred form of the present invention, an alignment mark is formed on the front surface of a wafer on which surface a resist material is applied, but an alignment signal is obtained by projecting an alignment light, with respect to which the material of the wafer shows transmissibility, upon the rear surface of the wafer on which surface no resist material is applied. Thus, the alignment signal is also obtainable not through the resist layer. Therefore, in the present invention, alignment signals are obtainable without being affected by the resist material, such that undesireable deterioration of alignment accuracy is avoided whereby the alignment accuracy can be advantageously improved.

Also, the provision of alignment marks on the rear surface of a wafer is advantageous because it does not require any specific area on the front surface of the wafer for the provision of wafer alignment marks. This increases the efficiency of utilization of the surface of the wafer (workpiece). Further, in the repeated processing of each wafer for the superimposition of a number of different patterns, during the manufacture of semiconductor devices, one and the same alignment mark can be used for such repeated wafer processing.

It is another object of the present invention to provide a projection exposure apparatus by which a pattern formed on a reticle can be accurately and exactly superimposed upon a pattern formed on a wafer.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
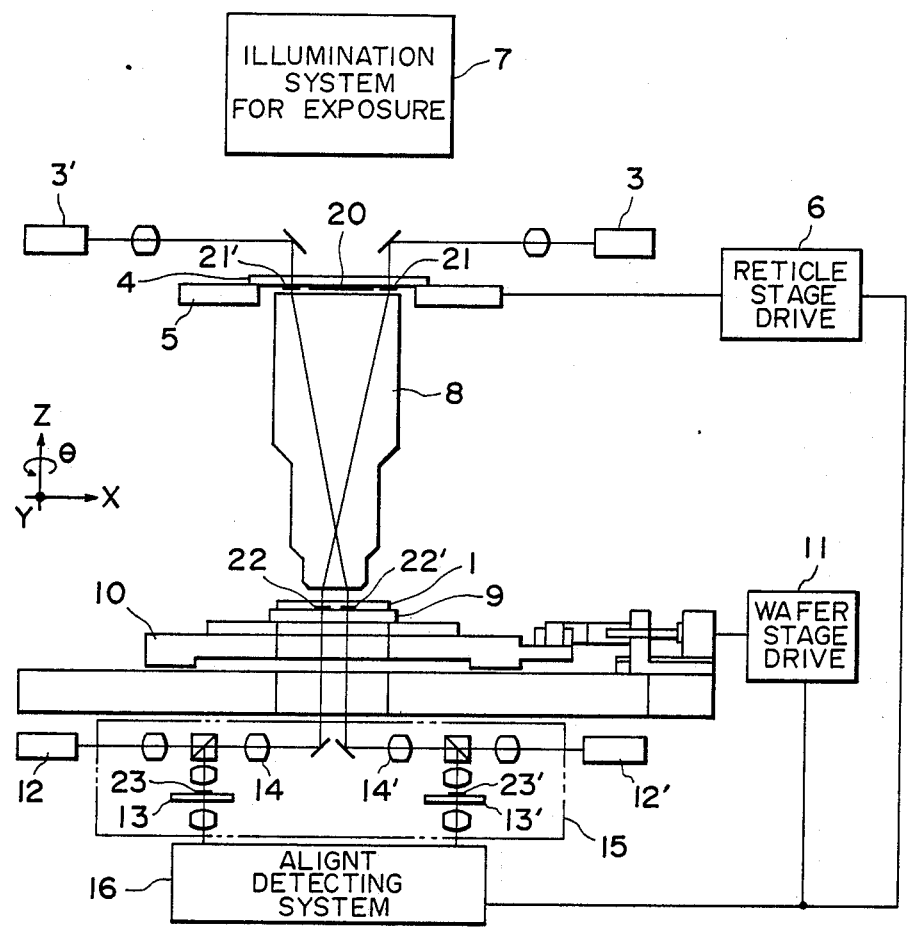
FIG. 1 is a schematic and diagrammatic view of a projection exposure apparatus according to an embodiment of the present invention.

Referring now to FIG. 1, there is shown a step-and-repeat type reduction projection exposure apparatus according to an embodiment of the present invention. In FIG. 1, denoted at 1 is a semiconductor wafer, which is a workpiece, having a resist layer applied to its surface. Denoted at 4 is a reticle, which is an original, having formed on its lower surface a desired pattern 20 to be transferred onto each of different shot areas on the wafer 1, as well as alignment marks 21 and 21' to be used for the alignment of the reticle 4 in the manner which will be described later. The exposure apparatus includes light sources 3 and 3' for providing light to be used for the reticle alignment; a reticle stage 5 for holding the reticle 4; a reticle stage driving system 6 for moving the reticle stage 5 so as to adjust and set the position of the reticle 4 in each of X, Y and $\theta$ (rotational) directions; an illumination system 7 for illuminating the reticle 4 so that the pattern 20 of the reticle 4 is photoprinted on the resist layer provided on the wafer 1 surface; a projection lens system 8 for imaging, in a reduced scale, the pattern 20 and the alignment marks 21 and 21' of the reticle 4 on the plane of the wafer 1 surface; a wafer chuck 9 for holding the wafer 1 and being movable to move the wafer 4 in each of Z and $\theta$ directions; a wafer stage 10 for supporting the wafer chuck 9 and being movable in each of the X and Y directions to a desired position; and a wafer stage driving system 11 for moving the wafer stage 10 with high precision. The apparatus further includes light sources 12 and 12' for providing light to be used for the alignment of the wafer 1; reference plate members 13 and 13' each having formed thereon a reference mark 23 or 23' which is to be used as a reference for a corresponding one of reticle alignment marks 21 and 21' for the reticle alignment and for a corresponding one of the wafer alignment marks 22 and 22' for the wafer alignment, as will be described later in more detail and relay lenses 14 and 14' each of which is made movable in the direction of its optical axis. The reference mark 23 (23') is provided at a position which is, in the illustrated state, optically conjugate with the surface of the wafer chuck 9 (namely, the wafer carrying surface thereof) with respect to the relay lens 14 (14') and so on. To allow this, namely to allow observation of the reticle alignment marks 21 and 21' and the wafer alignment marks 22 and 22' through the wafer chuck 9 (the manner of observation will be described later in detail), the wafer chuck 9 may be provided with throughbores formed at positions corresponding to the alignment marks 22 and 22' of the wafer 1 or the images of the reticle alignment marks 21 and 21' as being projected by the projection lens system 8. As an alternative, the wafer chuck 9 may be formed of a transparent glass material such as quartz, for example.

Denoted generally at 15 is an alignment optical system which includes the above-described relay lenses 14 and 14', the reference plate members 13 and 13' and so on. The alignment optical system 15 is arranged, in one aspect thereof, to project the alignment lights emitted from the light sources 12 and 12' upon the reference marks 23 and 23', respectively, and upon the wafer alignment marks 22 and 22', respectively, which are formed, in this embodiment, on the rear surface of the wafer 1 and which are related to a current shot area of the wafer 1 (the shot area that is going to be exposed to the reticle pattern 20). Suitable optical elements as depicted in FIG. 1 are included in the alignment optical system 15 for such projection purpose. By the irradiation of these marks with the light supplied from the light sources 12 and 12', optical signals necessary for the wafer alignment are obtained in the form of diffracted light from edges of these marks. In another aspect, the alignment optical system 15 is used to detect optical signals concerning the reticle alignment marks 21 and 21' as well as the reference marks 23 and 23', for the reticle alignment purpose. Denoted generally at 16 in FIG. 1 is an alignment detecting system which is provided to measure or detect any relative positional deviation between each wafer alignment mark and a corresponding one of the reference marks (or each reticle alignment mark and corresponding one of the reference marks). For the wafer alignment purpose, for example, the alignment detecting system 16 receives the optical signals obtained by the alignment optical system 15 and converts them into electric signals by use of a photodetector (image sensor). On the basis of the thus obtained electric signals, the relative positional deviation of the wafer alignment marks 23 and 23' to the reference marks 13 and 13' with respect to each of the X, Y and $\theta$ directions is detected.

The alignment and exposure operation of the projection exposure apparatus of the FIG. 1 embodiment will now be described in more detail.

Prior to the alignment and exposure of the wafer 1, the alignment operation for the reticle 4 placed on the reticle stage 5 is conducted by use of the reticle alignment marks 21 and 21' formed on the reticle 4 and the reference marks 23 and 23' provided on the reference plate members 13 and 13'. For this reticle alignment, no wafer is placed on the wafer chuck 9. In this state, the light sources 3 and 3' are energized so as to illuminate the alignment marks 21 and 21' of the reticle 4. By this, images (aerial images) of these marks are formed by means of the projection lens system 8 at positions slightly above the wafer chuck 9, e.g. the positions which are contained in the plane of the wafer 1 surface when the wafer is placed on the wafer chuck 9. At this time, the relay lenses 14 and 14' are displaced minutely each in the direction of its optical axis, so that the aerial images of the alignment marks 21 and 21' being formed above the wafer chuck 9 are reimaged upon the reference plate members 13 and 13', respectively, at positions in close proximity to the reference marks 23 and 23'. Then, the alignment detecting system 16 is used to calculate the relative positional deviation of the reticle alignment mark 21 and 21' to the reference marks 23 and 23' and, thereafter, the reticle stage driving system 6 operates to move the reticle stage 5 so as to correct the thus detected positional deviation. By this, the reticle alignment is accomplished.

Subsequently, the alignment and exposure operation using the wafer 1 is initiated. It is to be noted that, for the wafer alignment, the relay lenses 14 and 14' having been moved minutely at the time of reticle alignment are moved back to their initial positions, i.e. the positions at which the relay lenses 14 and 14' assist in bringing the reference marks 23 and 23' into the optically conjugate relation with the rear surface of the wafer 1 as it is held by the wafer chuck 9.

First, for the wafer alignment, the wafer 1 is placed on and held by the wafer chuck 9. In this state, the light sources 12 and 12' are energized and the alignment light emitted from the light sources 12 and 12', respectively, are projected upon the rear surface of the wafer chuck 9 by means of the alignment optical system 15. The light incident upon the rear surface of the wafer chuck 9 passes upwardly through the wafer chuck and illuminated the rear surface of the wafer 1. On this rear surface of the wafer 1, desired alignment marks 22 and 22' are preparatively formed. In this embodiment, each wafer alignment mark is in the form of a groove provided on the rear surface of the wafer 1. These wafer alignment marks may be formed by use of a well-known photolithographic technique. It is to be noted that, in the present embodiment, these wafer alignment marks are formed on such a wafer (called "virgin wafer") on which no circuit pattern is photoprinted.

In this manner, the wafer alignment marks 22 and 22' are illuminated. At the same time, a portion of the light supplied from the light source 12 (12') is used to illuminate the reference mark 23 (23'). When the wafer alignment marks 22 and 22' and the reference marks 23 and 23' are illuminated by the lights supplied from the light sources 12 and 12', the lights are diffracted by the edges of these marks and the diffracted lights are received by the alignment detecting system 16 as optical alignment signals. On the basis of these optical signals, the alignment detecting system 16 detects, by calculation, the positional deviation of the wafer alignment marks 22 and 22', in each of the X, Y and θ directions, with respect to the reference marks 23 and 23' provided at the points which are optically conjugate with the rear surface of the wafer 1 (i.e. the front surface of the wafer chuck 9). Then, in accordance with the result of detection, the wafer stage driving system 11 operates to move the wafer stage 10 and, thus, the wafer chuck 9 so as to correct the detected positional deviation. In the present embodiment, the wafer chuck 9 is made of a material that has sufficient transmissibility for the light from the light sources 3, 3', 12 and 12'. Also, the wafer stage 10 has a sufficient height that is effective to provide a sufficient optical path length between the wafer 1 and the alignment optical system 15.

In this manner, the wafer alignment using the reference marks 23 and 23' is accomplished. Thereafter, the light from the illumination system 7 is used to illuminate the pattern 20 of the reticle 4 having been aligned also by use of the reference marks 23 and 23'. By this, the reticle pattern 20 is imaged upon the wafer 1 surface by means of the projection lens system 8, whereby the reticle pattern is photoprinted on the wafer. It is to be noted that the alignment marks 22 and 22' provided on the rear surface of the wafer 1 are not exposed to the photoprinting light from the illumination system 7 during the exposure of the wafer. Also, it is easily possible to prevent these wafer alignment marks from being adversely affected by a subsequent etching treatment of the wafer 1. Accordingly, these wafer alignment marks 22 and 22' can be used repeatedly for the repeated photoprinting processes to be made to the wafer 1 for superimposing plural patterns upon the wafer 1 in sequence.

Figures 2, 3:
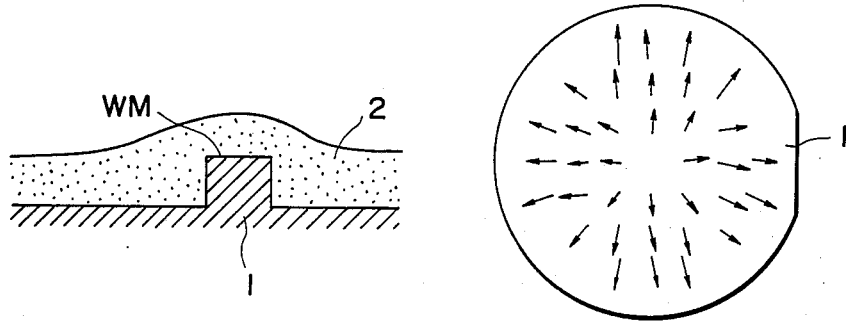
FIG. 2 is a fragmentary sectional view of a wafer coated with a resist material.
FIG. 3 is a representation of a map schematically showing an example of the distribution of alignment errors.

The present invention is not limited to the form of the above-described embodiment. Various modifications are possible with substantially the same advantageous effects. For example, in the FIG. 1 arrangement, the wafer alignment marks may be formed on the front surface (upper surface) of the wafer 1. Each wafer alignment mark may be in the form of a surface protrusion such as one shown in FIG. 2 or, alternatively, a recess or groove as in the FIG. 1 embodiment. Also, in this case, each light source 12 or 12' is replaced by a suitable light source that produces a light of a certain wavelength to which the material of the wafer 1 shows sufficient transmissibility. If this approach is adopted, it is possible to detect the wafer alignment mark, formed on the upper surface of the wafer, from the back of the wafer. Thus, an alignment signal is obtainable from the wafer alignment mark without being adversely affected by the resist layer applied to the upper surface of the wafer. In this case, as understood, there is no necessity of preparatively providing alignment marks on the rear surface of the wafer. As for a particular light source producing a light that can pass through the wafer 1, which is usually made of silicone, a carbon dioxide gas laser producing a light of 10.31 microns in wavelength is suitable, for example.

While the invention has been described with reference to the structures disclosed herein, it is not confined to the details set forth and this application is intended to cover such modifications or changes as may come within the purposes of the improvements or the scope of the following claims.

What is claimed is:

1. An alignment method, for relatively aligning an original and a workpiece, in a projection exposure apparatus for projecting a pattern of the original upon a surface of the workpiece by use of a projection optical system, said method comprising:
    an imaging step for forming an image of an alignment mark on the original through the projection optical system;
    a first detecting step for reimaging, upon a predetermined reference plane, the image of the alignment mark on the original through a detection optical system provided on a side of the projection optical system remote from the original, and then for detecting the alignment mark of the original by use of the image formed by said reimaging, said first detecting step being carried out with the workpiece located so as to not interfere with the detection of the alignment mark on the original;
    an introducing step for bringing the workpiece to a position between the projection optical system and the detection optical system;
    a second detecting step for imaging through the detection optical system upon the reference plane, an alignment mark provided on the side of the workpiece opposite the side thereof facing the projection optical system, and then for detecting the formed image of the alignment mark on the workpiece; and
    an aligning step for relatively aligning the original and the workpiece on the basis of the detection at said first and second detecting steps.

2. A method according to claim 1, wherein said second detecting step includes the step of adjustment of the detection optical system for imaging the alignment mark of the workpiece upon the reference plane.

3. A method according to claim 2, wherein the adjustment step is made by changing the position of a lens of the detection optical system in a direction of an optical axis of the detection optical system.

4. A method according to claim 1, wherein said first detecting step includes the step of detection of a positional relationship between the image of the alignment mark on the original, formed by said reimaging step, and a reference provided in the detection optical system, and wherein said second detecting step includes detection of a positional relationship between the image of the alignment mark on the workpiece and the reference in the detection optical system.

5. An alignment method, for relatively aligning an original and a workpiece, in a projection exposure apparatus for projecting a pattern of the original upon the surface of the workpiece by use of a projection optical system, said method comprising:
   an imaging step of forming an image of an alignment mark on the original through the projection optical system;
   a first detecting step for reimaging, upon a predetermined reference plane, the image of the alignment mark on the original through a detection optical system provided on a side of the projection optical system remote from the original, and then for detecting the alignment mark on the original by use of the image formed by reimaging, said first detecting step being carried out with the workpiece located so as not to interfere with the detection of the alignment mark on the original;
   a first positioning step for positioning the original with respect to the detection optical system on the basis of the detection by said first detecting step;
   an introducing step for placing the workpiece at a position between the projection optical system and the detection optical system;
   a second detecting step for detecting an alignment mark on the workpiece through the detection optical system, said second detecting step including adjustment of the detection optical system for bringing the side of the workpiece opposite the side thereof facing the projection optical system and the reference plane into an optically conjugate relationship, and formation of an image of the alignment mark on the workpiece upon the reference plane; and
   a second positioning step for positioning the workpiece with respect to the detection optical system on the basis of the detection by said second detecting step.

6. A device with a projection system, for detecting the positional relationship between an original having an alignment pattern and a workpiece having an alignment mark, wherein the original can be imaged upon the workpiece by projection through said projection system, said device, comprising:
   a stage for supporting thereon the workpiece with its alignment mark facing a side remote from the original, said stage being movable in a plane which is orthogonal to an axis of the projection system, and said stage including a transmitting portion which is effective to transmit an image of the alignment pattern of the original, being projected by the projection system, and also to transmit light from the alignment mark of the workpiece, both in a direction away from the original with respect to the projection system; and
   detecting means for detecting the image of the alignment pattern transmitted through said transmitting portion and for detecting the light from the alignment mark of the workpiece as transmitted through said transmitting portion, to detect the positional relationship between the alignment pattern of the original and the alignment mark of the workpiece, such that the positional relationship between the original and the workpiece can be detected.

7. A device according to claim 6, wherein said detecting means includes an imaging optical system by which the image of the alignment pattern being projected by the projection system can be reimaged upon a predetermined image plane and by which the alignment mark of the workpiece can be imaged upon the same image plane.

8. A device according to claim 7, wherein said imaging optical system includes a movable lens which is movable along an optical axis of said imaging optical system and wherein said movable lens is adapted to be positioned at different sites for the reimaging of the image of the alignment pattern and for the imaging of the alignment mark, both upon said predetermined image plane.

9. A device according to claim 6, wherein said detecting means includes a first illumination system for illuminating the alignment mark of the workpiece through said transmitting portion.

10. A device according to claim 9, further comprising a second illumination system for illuminating the original for projection of the image of its alignment pattern through the projection system.

11. A device according to claim 10, further comprising an original stage for supporting thereon the original and being movable in a plane orthogonal to the axis of the projection system.

12. An alignment method, for relatively aligning an original and a workpiece, in a projection exposure apparatus for projecting a pattern of the original upon the workpiece by use of a projection system, said method comprising:
   an imaging step for forming an image of an alignment mark of the original through the projection system;
   a first detecting step for detecting the image of the alignment mark of the original through a detection optical system provided at a side of the projection system remote from the original, said first detecting step being carried out with the workpiece located so as not to interfere with the detection of the image of the alignment mark of the original;
   an introducing step for bringing the workpiece to a position between the projection system and the detection optical system;
   a second detecting step for detecting through the detection optical system an alignment mark provided on the workpiece; and
   an aligning step for relatively aligning the original and the workpiece on the basis of the detection at said first and second detecting steps.

13. A method according to claim 12, wherein the alignment mark of the workpiece is formed on a side thereof facing the detection optical system and is detected by the detection optical system.

14. A method according to claim 12, wherein the alignment mark of the workpiece is formed on a side thereof opposite to the side facing the detection optical system.

15. A method according to claim 14, wherein said second detecting step includes irradiating the alignment mark by using a carbon dioxide laser and from the detection optical system side.

16. A device usable with a projection system, for detecting the positional relationship between an original having an alignment pattern and a workpiece having an alignment mark, wherein the original can be imaged upon the workpiece by projection through the projection system, said device comprising:

a stage for supporting thereon the workpiece and being movable in a plane orthogonal to an optical axis of the projection system, said stage including a transmitting portion which is effective to transmit an image of the alignment pattern of the original projected by the projection optical system, and also to transmit light from the alignment mark of the workpiece, both in a direction away from the original with respect to the projection system; and detecting means for detecting the image of the alignment pattern transmitted through said transmitting portion and for detecting the light from the alignment mark as transmitted through said transmitting portion, to detect the positional relationship between the alignment pattern of the original and the alignment mark of the workpiece, such that the positional relationship between the original and the workpiece can be detected.

17. A device according to claim 16, wherein said detecting means includes an imaging optical system by which the image of the alignment pattern projected by the projection system can be reimaged upon a predetermined image plane and by which the alignment mark of the workpiece can be imaged upon the same image plane.

18. A device according to claim 17, wherein the alignment mark of the workpiece is formed on a side thereof opposite to the side facing said detecting means and wherein said detecting means is arranged to detect the alignment mark of the workpiece so formed.

19. A device according to claim 17, wherein the alignment mark of the workpiece is formed on a side thereof facing said detecting means and wherein said detecting means is arranged to detect the alignment mark of the workpiece so formed.

20. A device according to claim 19, wherein said detecting means includes an illumination system having a carbon dioxide laser, for irradiating the alignment mark with light from said laser and through said transmitting portion.

* * * * *

UNITED STATES PATENT AND TRADEMARK OFFICE
CERTIFICATE OF CORRECTION

PATENT NO. : 4,952,060

DATED : August 28, 1990

INVENTOR(S) : HIDEKI INA, ET AL.

It is certified that error appears in the above-identified patent and that said Letters Patent is hereby corrected as shown below:

On the Title page

IN [56] REFERENCES CITED

U.S. PATENT DOCUMENTS, "Tamimoto et al." should read --Tanimoto et al.--.

COLUMN 1

Line 51, "signal-   to-noise" should read --signal-to-noise--.

COLUMN 2

Line 10, "the," (second occurrence) should read --the--.

COLUMN 3

Line 50, "detail" should read --detail;--.

COLUMN 5

Line 14, "nated" should read --nates--.

UNITED STATES PATENT AND TRADEMARK OFFICE
CERTIFICATE OF CORRECTION

PATENT NO. : 4,952,060
DATED : August 28, 1990
INVENTOR(S) : HIDEKI INA, ET AL.

It is certified that error appears in the above-identified patent and that said Letters Patent is hereby corrected as shown below:

COLUMN 8

Line 50, "to" (first occurrence) should be deleted.

Signed and Sealed this

First Day of September, 1992

Attest:

DOUGLAS B. COMER

Attesting Officer

Acting Commissioner of Patents and Trademarks